(12) United States Patent
Yu

(10) Patent No.: US 8,420,953 B2
(45) Date of Patent: Apr. 16, 2013

(54) DUMMY MEMORY CARD

(75) Inventor: Meng-Che Yu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 246 days.

(21) Appl. No.: 12/941,985

(22) Filed: Nov. 8, 2010

(65) Prior Publication Data

US 2012/0103674 A1    May 3, 2012

(30) Foreign Application Priority Data

Oct. 27, 2010  (TW) ............................... 99136621 A

(51) Int. Cl.
*H05K 1/11* (2006.01)
(52) U.S. Cl.
USPC .......... 174/261; 174/265; 361/737; 361/748; 361/777; 361/803; 361/794; 361/799

(58) Field of Classification Search .................. 174/261, 174/262, 265–268; 361/737, 748, 792, 794, 361/799, 788, 777, 786, 803
See application file for complete search history.

(56) References Cited

U.S. PATENT DOCUMENTS

| | | | |
|---|---|---|---|
| 5,734,208 A * | 3/1998 | Jones | 307/139 |
| 6,654,270 B2 * | 11/2003 | Osaka et al. | 365/51 |
| 6,665,736 B1 * | 12/2003 | Fan | 710/2 |
| 7,788,421 B1 * | 8/2010 | Heath et al. | 710/15 |
| 2003/0016516 A1 * | 1/2003 | McCall et al. | 361/803 |
| 2006/0244134 A1 * | 11/2006 | Inagaki et al. | 257/734 |
| 2008/0061803 A1 * | 3/2008 | Lane | 324/715 |
| 2009/0279273 A1 * | 11/2009 | Sugane et al. | 361/794 |

* cited by examiner

*Primary Examiner* — Hoa C Nguyen
(74) *Attorney, Agent, or Firm* — Altis Law Group, Inc.

(57) ABSTRACT

A dummy memory card includes a circuit board and a golden finger board. The circuit board includes a first conductive element and a second conductive element connected to a first electrical load. The golden finger board extends from the circuit board and is inserted into a memory slot of a motherboard. The golden finger board includes a first power pin and a first ground pin. The first conductive element is electrically connected to the first power pin. The second conductive element is electrically connected to the second power pin.

8 Claims, 4 Drawing Sheets

DUMMY MEMORY CARD

BACKGROUND

1. Technical Field

The present disclosure relates to a dummy memory card.

2. Description of Related Art

There are memory cards installed in the motherboards of computers. Before shipment, the motherboards need to be tested under certain conditions. In one test condition, different kinds of memory cards need to be installed on the motherboards. However, using real memory cards may increase test cost, and damage the memory if the motherboards have a design flaw.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
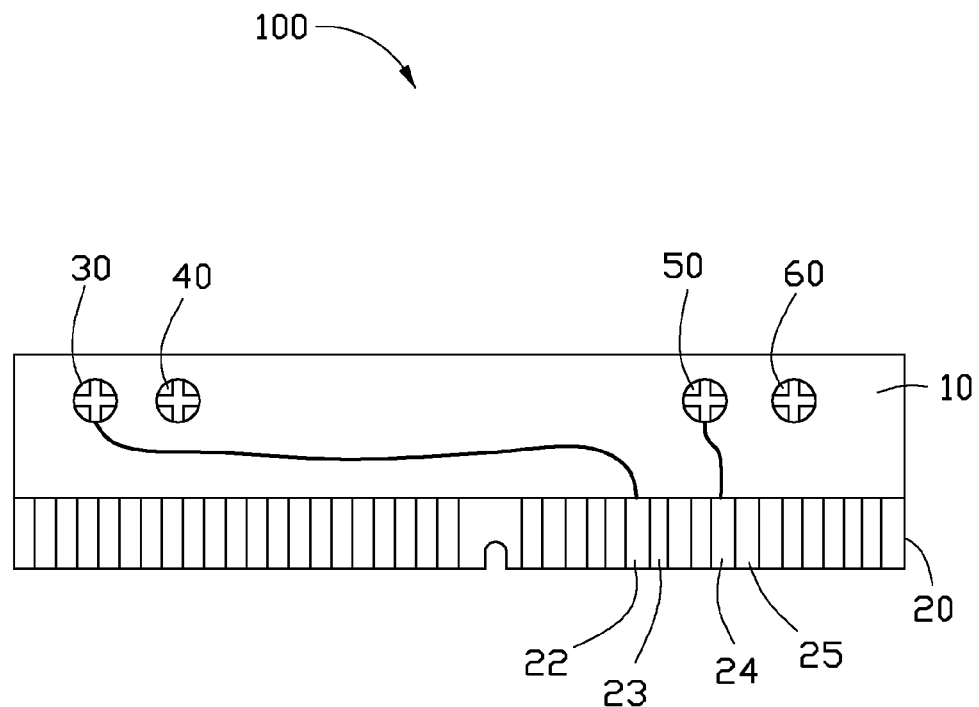
FIG. 1 is a front plane view of an embodiment of a dummy memory card including a ground layer.
Figure 2:
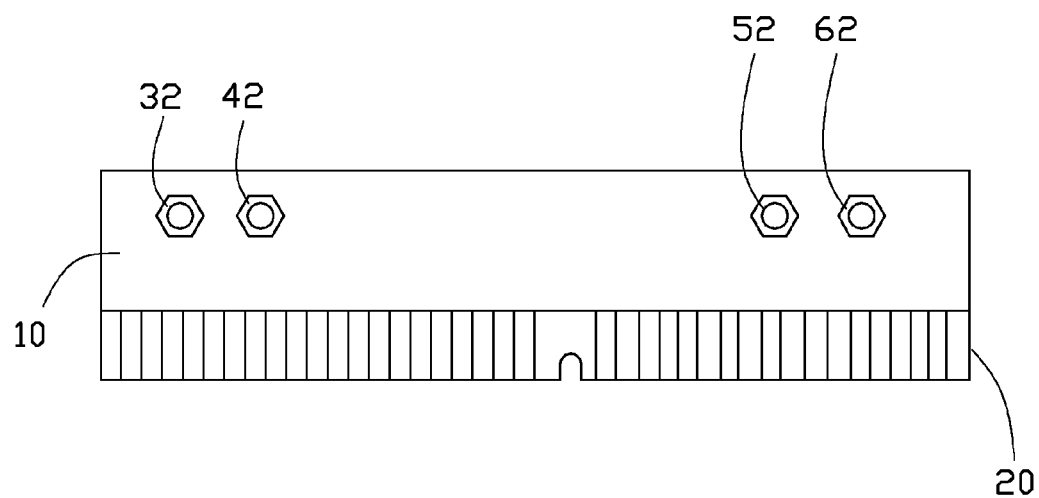
FIG. 2 is a rear plane view of the dummy memory card of FIG. 1.
Figure 3:
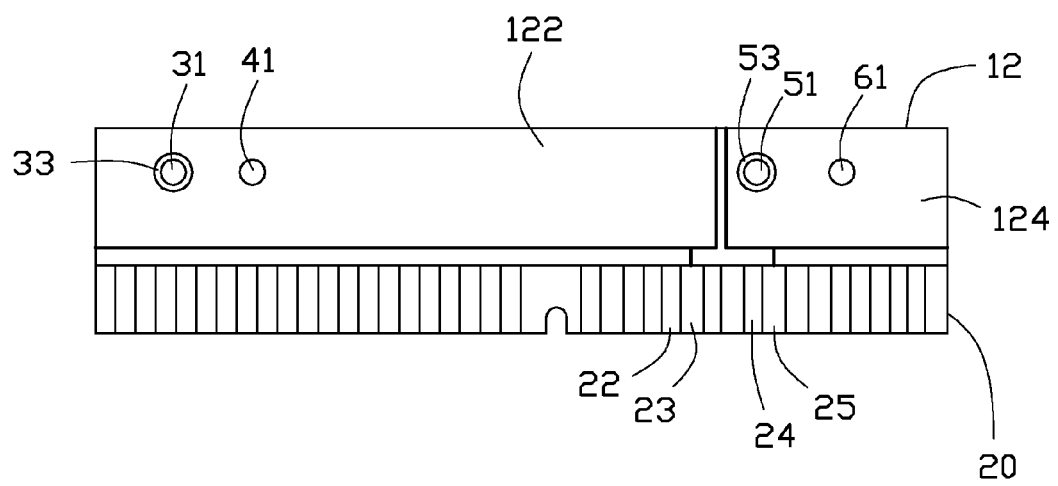
FIG. 3 is schematic view of the ground layer of the dummy memory card of FIG. 1.

Referring to FIGS. 1 to 3, an embodiment of a dummy memory card 100 includes a circuit board 10 and a golden finger board 20 extending from a side of the circuit board 10. The golden finger board 20 satisfies common memory standard, namely, the dummy memory card 100 can be inserted in a memory slot 210 of a motherboard 200 (shown in FIG. 4) through the golden finger board 20.

The circuit board 10 defines first to fourth conductive screw holes 31, 41, 51, and 61. In one embodiment, the inside walls of the first to fourth conductive screw holes 31, 41, 51, and 61 are conductive. The first and second conductive screw holes 31 and 41 are adjacent to a first end of the circuit board 10, and the third and fourth conductive screw holes 51 and 61 are adjacent to a second end of the circuit board 10 opposite to the first end. The circuit board 10 further includes first to fourth conductive screw poles 30, 40, 50, and 60 respectively screwed into the first to fourth conductive screw holes 31, 41, 51, and 61 and then respectively screwed into four corresponding screw nuts 32, 42, 52 and 62. In other embodiments, the conductive screw holes 31, 41, 51, and 61 can be replaced by other conductive elements, and the number of the conductive screw holes can be adjusted according to requirements.

The golden finger board 20 includes a first power pin 22, a first ground pin 23 corresponding to the first power pin 22, a second power pin 24, and a second ground pin 25 corresponding to the second power pin 24. In one embodiment, the first power pin 22 is a 1.5 volt (V) power pin, and the second power pin 24 is a 0.75V power pin. In other embodiments, the number of the power pins and ground pins can be changed according to the number of the conductive screw holes of the circuit board 10.

The first conductive screw hole 31 is electrically connected to the first power pin 22 through a conductive trace on the circuit board 10. The third conductive screw hole 51 is electrically connected to the second power pin 24 through a conductive trace on the circuit board 10.

The circuit board 10 further includes an inside ground layer 12. In one embodiment, the circuit board 10 includes three layers, the ground layer 12 is sandwiched between the other two layers. The ground layer 12 includes a first ground portion 122 and a second ground portion 124, which is disconnected from the first ground portion 122. The first conductive screw hole 31 and the second conductive screw hole 41 are defined through the first ground portion 122. The third conductive screw hole 51 and the fourth conductive screw hole 61 are defined through the second ground portion 124. The ratio of the area of the first ground portion 122 to the area of the second ground portion 124 is equal to the ratio of the received voltage value of the first conductive screw hole 31 to the received voltage value of the third conductive screw hole 51. For example, if the first power pin 22 is a 1.5 volt (V) power pin and the second power pin 24 is a 0.75V power pin, the ratio of the area of the first ground portion 122 to the area of the second ground portion 124 is 1.5:0.75 or 2:1.

In the ground layer 12, the first ground portion 122 is electrically connected to the second conductive screw hole 41, and electrically connected to the first ground pin 23. An insulating ring 33 is formed on an inner sidewall bounding the first conductive screw hole 31, to keep the first conductive screw hole 31 disconnected from the first ground portion 122. The second ground portion 124 is electrically connected to the fourth conductive screw hole 61, and electrically connected to the second ground pin 25. An insulating ring 53 is formed on an inner sidewall bounding the third conductive screw hole 51, to keep the third conductive screw hole 51 disconnected from the second ground portion 124.

Figure 4:
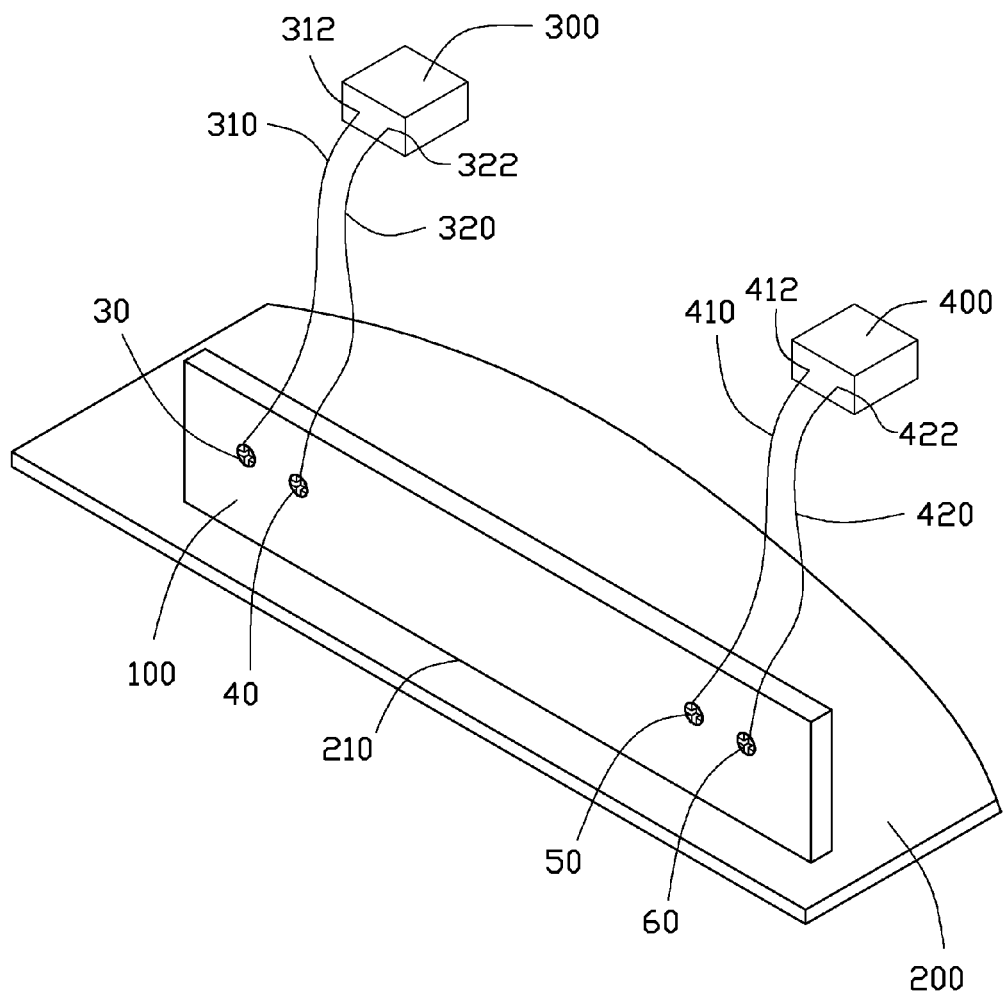
FIG. 4 is an assembled, isometric view of a motherboard to be tested and the dummy memory card of FIG. 1, together with two electrical loads.

Referring to FIG. 4, when using the dummy memory card 100 to test the motherboard 200, the dummy memory card 100 is inserted in the memory slot 210 of the motherboard 200 through the golden finger board 20. A power terminal 312 and a ground terminal 322 of a first electrical load 300 are respectively electrically connected to the first conductive screw pole 30 and the second conductive screw pole 40 through two power leads 310 and 320. A power terminal 412 and a ground terminal 422 of a second electrical load 400 are respectively electrically connected to the third conductive screw pole 50 and the fourth conductive screw pole 60 through two power leads 410 and 420. The motherboard 200 can use the first electrical load 300 and the second electrical load 400 as a required memory load through the dummy memory card 100. The first electrical load 300 and the second electrical load 400 can be easily replaced and are not expensive, therefore can reduce test cost.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A dummy memory card comprising:
   a circuit board comprising a first conductive element and a second conductive element, operable to be connected to a first electrical load; and
   a golden finger board extending from the circuit board, operable to be inserted in a memory slot of a motherboard, the golden finger board comprising a first power pin and a first ground pin, wherein the first conductive element is electrically connected to the first power pin, and the second conductive element is electrically connected to the first ground pin;
   wherein when the circuit board is connected to the first electrical load, the circuit board and the first electrical load are configured to simulate a memory card, the first conductive element and the second conductive element are conductive screw holes defined in the circuit board, the first electrical load is connected to the conductive screw holes through power leads connected to conductive screw poles screwed into the conductive screw holes.

2. The dummy memory card of claim 1, wherein the circuit board further comprises a ground layer, the second conductive element is connected to the first ground pin through the ground layer.

3. The dummy memory card of claim 1, wherein the circuit board further comprises a third conductive element and a fourth conductive element operable to be connected to a second electrical load, the golden finger board further comprises a second power pin and a second ground pin, the third conductive element is electrically connected to the second power pin, the fourth conductive element is electrically connected to the second ground pin.

4. The dummy memory card of claim 3, wherein the circuit board further comprises a ground layer comprising a first ground portion and a second ground portion disconnected from the first ground portion, the second conductive element is electrically connected to the first ground pin through the first ground portion, the fourth conductive element is electrically connected to the second ground pin through the second ground portion.

5. The dummy memory card of claim 4, wherein a ratio of an area of the first ground portion to an area of the second ground portion is equal to a ratio of a received voltage value of the first conductive element to a received voltage value of the third conductive element.

6. A dummy memory card comprising:
   a circuit board comprising a first conductive element and a second conductive element, operable to be connected to a first electrical load; and
   a golden finger board extending from the circuit board, operable to be inserted in a memory slot of a motherboard, the golden finger board comprising a first power pin and a first ground pin, wherein the first conductive element is electrically connected to the first power pin, and the second conductive element is electrically connected to the first ground pin;
   wherein the circuit board further comprises a third conductive element and a fourth conductive element operable to be connected to a second electrical load, the golden finger board further comprises a second power pin and a second ground pin, the third conductive element is electrically connected to the second power pin, the fourth conductive element is electrically connected to the second ground pin, when the circuit board is connected to the first electrical load, the circuit board and the first electrical load are configured to simulate a memory card.

7. The dummy memory card of claim 6, wherein the circuit board further comprises a ground layer comprising a first ground portion and a second ground portion disconnected from the first ground portion, the second conductive element is electrically connected to the first ground pin through the first ground portion, the fourth conductive element is electrically connected to the second ground pin through the second ground portion.

8. The dummy memory card of claim 7, wherein a ratio of an area of the first ground portion to an area of the second ground portion is equal to a ratio of a received voltage value of the first conductive element to a received voltage value of the third conductive element.

* * * * *